(12) United States Patent
Kadosh et al.

(10) Patent No.: US 6,764,908 B1
(45) Date of Patent: Jul. 20, 2004

(54) NARROW WIDTH CMOS DEVICES FABRICATED ON STRAINED LATTICE SEMICONDUCTOR SUBSTRATES WITH MAXIMIZED NMOS AND PMOS DRIVE CURRENTS

(75) Inventors: Daniel Kadosh, Austin, TX (US); Derick J. Wristers, Bee Caves, TX (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/173,770

(22) Filed: Jun. 19, 2002

(51) Int. Cl.[7] .............................................. H01L 21/336
(52) U.S. Cl. ....................................... 438/285; 257/192
(58) Field of Search ........................... 438/285; 257/192

(56) References Cited

U.S. PATENT DOCUMENTS 5,847,419 A * 12/1998 Imai et al. .................. 257/192
5,951,757 A * 9/1999 Dubbelday et al. ......... 117/102
6,265,253 B1   7/2001 Lukanc et al.
6,339,232 B1 * 1/2002 Takagi ........................ 257/192

* cited by examiner

Primary Examiner—John F. Niebling
Assistant Examiner—Christopher Lattin

(57) ABSTRACT

A method of manufacturing a semiconductor device comprises steps of: (a) providing a semiconductor substrate comprising an upper, tensilely strained lattice semiconductor layer and a lower, unstressed semiconductor layer; and (b) forming at least one MOS transistor on or within the tensilely strained lattice semiconductor layer, wherein the forming comprises a step of regulating the drive current of the at least one MOS transistor by adjusting the thickness of the tensilely strained lattice semiconductor layer. Embodiments include CMOS devices formed in substrates including a strained Si layer lattice-matched to a graded composition Si—Ge layer, wherein the thickness of the strained Si layer of each of the PMOS and NMOS transistors is adjusted to provide each transistor type with maximum drive current.

20 Claims, 2 Drawing Sheets

NARROW WIDTH CMOS DEVICES FABRICATED ON STRAINED LATTICE SEMICONDUCTOR SUBSTRATES WITH MAXIMIZED NMOS AND PMOS DRIVE CURRENTS

FIELD OF THE INVENTION

The present invention relates to methods of manufacturing improved performance, narrow width, high operating speed, CMOS devices comprised of one or more of each of NMOS and PMOS transistors, on strained lattice semiconductor substrates, and to improved CMOS devices obtained thereby. More specifically, the present invention relates to methods for fabricating such devices wherein the stress level within the strained lattice semiconductor layer of the NMOS and PMOS portions of the device is differentially adjusted to maximize the respective drive currents.

BACKGROUND OF THE INVENTION

The escalating requirements for high density and performance associated with ultra-large-scale integration (ULSI) semiconductor devices require design features of 0.18 μm and below, e.g., such as 0.15 μm and 0.12 μm, increased transistor and circuit speeds, high reliability, and increased manufacturing throughput for economic competitiveness. The reduction of design features to 0.18 μm and below challenges the limitations of conventional semiconductor materials and manufacturing techniques.

A conventional approach for forming a plurality of active devices in or on a common semiconductor substrate, e.g., as in the case of forming CMOS devices comprising at least a pair of PMOS and NMOS transistors in spaced adjacency, involves division of a starting material, i.e., a semiconductor substrate of suitable characteristics, into active regions where the transistors are to be formed, and field dielectric regions that electrically isolate adjacent active regions.

According to current technology utilizing conventional crystalline semiconductor wafers as substrates, the starting material may, for example, comprise a lightly p-doped epitaxial ("epi") layer of silicon (Si) grown on a heavily-doped, crystalline Si substrate. The low resistance of the heavily-doped substrate is necessary for minimizing susceptibility to latch-up, whereas the light doping of the epi layer permits independent tailoring of the doping profiles of both the p-type and n-type wells formed therein as part of the fabrication sequence, thereby resulting in optimal PMOS and NMOS transistor performance.

The use of the very thin epi layers, i.e., several μm thick, is made possible by performing the isolation processing by means of shallow trench isolation ("STI") techniques rather than by high temperature local oxidation of silicon ("LOCOS") technology. The STI technique advantageously minimizes up-diffusion of p-type dopant(s) from the more heavily-doped substrate into the lightly-doped epi layer. In addition, and critical for fabrication of devices with design rule of 0.25 μm and below, STI allows for closer spacing of adjacent active areas by avoiding the "bird's beak" formed at the edge of each LOCOS isolation structure. STI also provides better isolation by creating a more abrupt structure, reduces the vertical step from active area to isolation to improve gate lithography control, eliminates the high temperature field oxidation step that can cause problems with large diameter, i.e., 8 inch, wafers, and is scalable to future logic technology generations.

Recently, there has been much interest in various approaches with the aim or goal of developing new semiconductor materials which provide increased speeds of electron and hole flow therethrough, thereby permitting fabrication of semiconductor devices, such as integrated circuit (IC) devices with higher operating speeds, enhanced performance characteristics, and lower power consumption. One such material which shows promise in attaining the goal of higher device operating speeds is termed "strained silicon".

According to this approach, a very thin, tensilely strained, crystalline silicon (Si) layer is grown on a relaxed, graded composition Si—Ge buffer layer several microns thick, which Si—Ge buffer layer in turn is formed on a suitable crystalline substrate, e.g., a Si wafer or a silicon-on-insulator (SOI) wafer. Strained Si technology is based upon the tendency of the Si atoms, when deposited on the Si—Ge buffer layer, to align with the greater lattice constant (spacing) of the Si and Ge atoms therein (relative to pure Si). As a consequence of the Si atoms being deposited on a substrate (Si—Ge) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

However, a problem exists with respect to the design and fabrication of optimal performance CMOS devices comprised of at least one pair of narrow-width (W) PMOS and NMOS transistors less than about 1 μm wide utilizing strained lattice semiconductor substrates. Specifically, it has heretofore been difficult to manufacture narrow-width CMOS devices based on strained lattice semiconductor substrates wherein the drive currents of the PMOS and NMOS transistor components thereof are simultaneously maximized. Consider the following apparent competing characteristics or tendencies of narrow-width PMOS and NMOS transistors:

(1) when PMOS and NMOS transistors are fabricated with narrow widths (i.e., <1 μm) utilizing STI methodology for segmentation of the substrate into active regions where the transistors are to be formed, a compressive stress is exerted on the upper stratum or layer of the adjacent active device regions of the segmented semiconductor substrate spaced apart by the STI region, arising from the insulative material, typically a silicon oxide, filling the STI trench. As a consequence, the drive current of a narrow width PMOS transistor fabricated on or within an active device area subject to such compressive stress is increased, relative to a similar-dimensioned PMOS transistor formed on or within an unstressed semiconductor substrate, whereas the drive current of a narrow width NMOS transistors fabricated on or within the active device area subject to such compressive stress is decreased, relative to a similar-dimensioned NMOS transistors formed on or within an unstressed semiconductor substrate; and (2) the drive current of a PMOS transistor fabricated on or within a tensilely stressed active device area formed in a strained lattice semiconductor substrate, e.g., strained Si on Si—Ge, is decreased, relative to a similar dimensioned PMOS transistor formed on or within an unstressed semiconductor substrate, whereas the drive current of an NMOS transistor fabricated on or within a tensilely stressed active device area is increased, relative to a similar-dimensioned NMOS transistor formed on or within an unstressed semiconductor substrate.

Accordingly, and in view of the above-described apparent competing characteristics or tendencies of PMOS and NMOS transistors, there exists a need for improved semiconductor design and manufacturing methodology for fabricating CMOS devices on strained lattice semiconductor substrates comprised of narrow-width constituent PMOS and NMOS transistors, which methodology recognizes the above competing effects on the PMOS and NMOS drive currents. Moreover, there exists a need for improved methodology for CMOS device fabrication on strained lattice semiconductor substrates which is fully compatible with conventional process flow for automated manufacturing at rates consistent with the requirements for economic competitiveness.

The present invention, wherein the level of tensile stress in the strained semiconductor layer segments forming active regions for PMOS and NMOS transistors are differentially adjusted (i.e., maximized or minimized) by thickness variation thereof, to maximize the drive currents of both transistor types, effectively eliminates, or at least minimizes, disadvantageous unbalanced drive current performance of the PMOS and NMOS transistors arising from the above-described apparent competing characteristics or tendencies. As a consequence, the inventive methodology facilitates design and manufacture of high speed, high performance, reduced power consumption CMOS devices utilizing strained semiconductor technology. Further, the methodology afforded by the present invention enjoys diverse utility in the manufacture of numerous and various MOSFET-based semiconductor devices and/or components which require use of strained semiconductor technology for enhancement of device speed and reduced power consumption.

DISCLOSURE OF THE INVENTION

An advantage of the present invention is an improved method for manufacturing a semiconductor device comprising a strained lattice semiconductor layer.

Another advantage of the present invention is an improved method for manufacturing a MOS transistor device comprising a strained lattice semiconductor layer.

Yet another advantage of the present invention is an improved method for manufacturing a CMOS device comprising a strained lattice semiconductor layer, wherein the drive currents of the component PMOS and NMOS transistors are maximized.

Still another advantage of the present invention is an improved semiconductor device comprising a strained lattice semiconductor layer.

A further advantage of the present invention is an improved MOS transistor device comprising a strained lattice semiconductor layer.

A still further advantage of the present invention is an improved CMOS device comprising a strained lattice semiconductor layer, wherein the drive currents of the component PMOS and NMOS transistors are maximized.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the invention, the foregoing and other advantages are obtained in part by a method of manufacturing a semiconductor device, comprising steps of:

(a) providing a semiconductor substrate comprising an upper, tensilely strained lattice semiconductor layer and a lower, unstressed semiconductor layer, and (b) forming at least one MOS transistor on or within the tensilely strained lattice semiconductor layer, wherein the forming comprises a step of regulating the drive current of the at least one MOS transistor by adjusting the thickness of the tensilely strained lattice semiconductor layer.

According to embodiments of the present invention, step (b) comprises forming the at least one MOS transistor as a PMOS transistor or an NMOS transistor having a narrow width less than about 1 $\mu$m; and according to certain embodiments of the invention, step (a) comprises providing a semiconductor substrate wherein the upper, tensilely strained lattice semiconductor layer has a pre-selected initial thickness; and step (b) comprises forming the at least one MOS transistor on or within the tensilely strained lattice semiconductor layer as a PMOS transistor, wherein the forming comprises a step of regulating the drive current of the PMOS transistor by reducing the thickness of the tensilely strained lattice semiconductor layer from the pre-selected initial thickness to a pre-selected final thickness, or step (a) comprises providing a semiconductor substrate wherein the upper, tensilely strained lattice semiconductor layer has a pre-selected initial thickness; and step (b) comprises forming the at least one MOS transistor on or within the tensilely strained lattice semiconductor layer as an NMOS transistor, wherein the forming comprises a step of regulating the drive current of the NMOS transistor by increasing the thickness of the tensilely strained lattice semiconductor layer from the pre-selected initial thickness to a pre-selected final thickness.

In accordance with a particular embodiment of the present invention:

step (a) comprises providing a semiconductor substrate wherein the upper, tensilely strained lattice semiconductor layer has a pre-selected initial thickness; and step (b) comprises steps of:

($b_1$) segmenting the substrate into at least one pair of adjacent active device areas separated by isolating means; and ($b_2$) forming a CMOS device comprising at least one pair of PMOS and NMOS transistors in the at least one pair of adjacent active device areas; wherein the drive current of the PMOS transistor is maximized by reducing the thickness of the tensilely strained lattice semiconductor layer of the respective active device area from the pre-selected initial thickness to a pre-selected final thickness, and the drive current of the NMOS transistor is maximized by increasing the thickness of the tensilely strained lattice semiconductor layer of the respective active device area from the pre-selected initial thickness to a pre-selected final thickness or by maintaining the thickness of the tensilely strained lattice semiconductor layer of the respective active device area at the pre-selected initial thickness.

According to embodiments of the present invention, step (a) comprises segmenting the substrate into the at least one pair of adjacent active device areas separated by shallow trench isolation (STI) means; and step (b) comprises reducing or increasing the thickness of the tensilely strained lattice semiconductor layer of the respective active device areas from the pre-selected initial thickness to the pre-selected final thickness by means of a semiconductor material removal or deposition process which, by itself, does not affect the tensile stress of the tensilely strained lattice semiconductor layer, whereby obtainment of device performance enhancements attributed to the tensilely strained lattice semiconductor layer is not compromised.

In accordance with certain embodiments of the present invention, step (a) comprises providing a semiconductor substrate including an upper, tensilely strained, crystalline silicon (Si) semiconductor layer lattice-matched to a lower, unstressed, crystalline silicon-germanium (Si—Ge) layer; and step (a) may further comprises providing the semiconductor substrate with a crystalline Si layer or wafer beneath the lower, unstressed, crystalline silicon-germanium (Si—Ge) layer.

Another aspect of the present invention is a semiconductor device, comprising:

(a) a semiconductor substrate including an upper, tensilely strained lattice semiconductor layer and a lower, unstressed semiconductor layer; and (b) at least one MOS transistor formed on or within the tensilely strained lattice semiconductor layer, wherein the drive current of the at least one MOS transistor is regulated to a pre-selected value by adjustment of the thickness of the tensilely strained lattice semiconductor layer.

According to certain embodiments of the present invention, the at least one MOS transistor is a PMOS transistor or an NMOS transistor having a narrow width less than about 1 $\mu$m; and according to particular embodiments, the at least one MOS transistor is a PMOS transistor and the drive current thereof is regulated to the pre-selected value by reducing the thickness of the tensilely strained lattice semiconductor layer from a pre-selected initial thickness to a pre-selected final thickness, or the at least one MOS transistor is an MMOS transistor and the drive current thereof is regulated to the pre-selected value by increasing the thickness of the tensilely strained lattice semiconductor layer from a pre-selected initial thickness to a pre-selected final thickness.

In accordance with further embodiments of the present invention, the semiconductor substrate is segmented into at least one pair of adjacent active device areas separated by isolating means; and the semiconductor device is a CMOS device comprising at least one pair of PMOS and NMOS transistors formed in the at least one pair of adjacent active device areas; wherein the drive current of the PMOS transistor is maximized by reducing the thickness of the tensilely strained lattice semiconductor layer of the respective active device area from a pre-selected initial thickness to a pre-selected final thickness, and the drive current of the NMOS transistor is maximized by increasing the thickness of the tensilely strained lattice semiconductor layer of the respective active device area from a pre-selected initial thickness to a pre-selected final thickness or by maintaining the thickness of the tensilely strained lattice semiconductor layer of the respective active device area at a pre-selected initial thickness.

According to particular embodiments of the present invention, the substrate is segmented into the at least one pair of adjacent active device areas by shallow trench isolation (STI) means, and the thickness of the tensilely strained lattice semiconductor layer of the respective active device areas is reduced or increased from the pre-selected initial thickness to the pre-selected final thickness by means of a semiconductor material removal or deposition process which, by itself, does not affect the tensile stress of the tensilely strained lattice semiconductor layer, whereby obtainment of device performance enhancements attributed to the tensilely strained lattice semiconductor layer is not compromised.

In accordance with certain embodiments of the present invention, the semiconductor substrate includes an upper, tensilely strained, crystalline silicon (Si) semiconductor layer lattice-matched to a lower, unstressed, crystalline silicon-germanium (Si—Ge) layer; and the semiconductor substrate further includes a crystalline Si layer or wafer beneath the lower, unstressed, crystalline silicon-germanium (Si—Ge) layer.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and like reference numerals are employed throughout to designate similar features, wherein.

DESCRIPTION OF THE INVENTION

The present invention is based upon the discovery by the present inventors that the drive currents of narrow width MOS transistor devices, e.g., <1 $\mu$m wide PMOS and NMOS constituent transistors of CMOS devices, can be simultaneously maximized to facilitate fabrication of high quality, high speed MOS-based semiconductor devices on or within strained lattice semiconductor materials and substrates, by means of a process which recognizes and takes into account the above-described competing characteristics or tendencies pertaining to the opposing effects of semiconductor lattice stress on the drive currents of PMOS and NMOS transistors. As a consequence of the inventive methodology, the benefit of enhanced device performance attributable to the increased electron and/or hole mobility and reduced power consumption provided by the use of strained lattice semiconductor materials and substrates are attainable in CMOS devices, which at the same time, exhibit maximum transistor drive currents.

A key feature of the present invention, therefore, is differential adjustment of the thickness of the strained semiconductor layer segments of each of the constituent PMOS and NMOS transistors of the CMOS device, whereby the level of tensile stress in the strained semiconductor layer segments forming the active regions for the PMOS and NMOS transistors are differentially adjusted (i.e., maximized or minimized), to maximize the drive currents of both transistor types. The inventive methodology effectively eliminates, or at least minimizes, disadvantageous unbalanced drive current performance of the PMOS and NMOS transistors arising from the above-described apparent competing characteristics or tendencies of PMOS and NMOS transistors as a function of the stress level of the strained lattice semiconductor layer. As a consequence, the inventive methodology facilitates design and manufacture of high speed, high performance, reduced power consumption CMOS devices utilizing strained semiconductor technology. Further, the methodology afforded by the present invention enjoys diverse utility in the manufacture of numerous and various MOSFET-based semiconductor devices and/or components which require use of strained semiconductor technology for enhancement of device speed and reduced power consumption.

Figure 1:
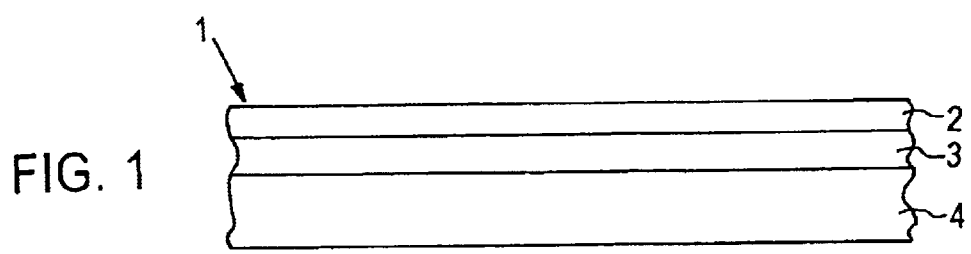
FIGS. 1–2 are schematic, simplified, cross-sectional views illustrating stages in a process for forming a CMOS device according to an embodiment of the present invention.

Referring to the accompanying drawing figures, shown therein are schematic, simplified, cross-sectional views illustrating several stages in an overall process for forming a CMOS transistor according to an illustrative, but non-limitative, embodiment of the present invention. With particular reference to FIG. 1, a substrate/workpiece 1 comprising a thin, strained lattice semiconductor layer 2 at an upper surface thereof is provided, which thin, strained lattice semiconductor layer 2 is lattice-matched to a relatively thicker, underlying crystalline semiconductor buffer layer 3 of different composition, the latter being in overlying contact with a suitable substrate 4. Typically, and by way of illustration only, the thin, strained lattice semiconductor layer 2 comprises a tensilely strained, crystalline Si layer having a pre-selected thickness (i.e., an initial thickness) from about 100 to about 2,000 Å, grown on a thicker (i.e., up to several $\mu$m thick), strain-relaxed, graded composition Si—Ge buffer layer 3, which buffer layer is in turn formed on a suitable substrate 4, e.g., a crystalline Si wafer or a silicon-on-insulator (SOI) substrate. As indicated supra, when the Si atoms of the strained lattice semiconductor layer 2 are deposited on the Si—Ge buffer layer 3 in alignment with the greater lattice constant (spacing) of the Si and Ge atoms therein, relative to pure Si, the deposited Si atoms tend to "stretch" to align with the underlying lattice of Si and Ge atoms, thereby "stretching' or tensilely straining Si layer 2. Electron and/or hole mobilities in such Si strained lattice semiconductor layers 2 formed on Si—Ge buffer layers 3 can be as much as about 70% faster than in conventional, relaxed lattice Si, and transistors and IC devices formed therewith can be up to about 35% faster than equivalent devices formed with conventional Si, without any requirement for size reduction.

Referring to the accompanying drawing figures, shown therein are schematic, simplified, cross-sectional views illustrating several stages in an overall process for forming a CMOS transistor according to an illustrative, but non-limitative, embodiment of the present invention. With particular reference to FIG. 1, a substrate/workpiece 1 comprising a thin, strained lattice semiconductor layer 2 at an upper surface thereof is provided, which thin, strained lattice semiconductor layer 2 is lattice-matched to a relatively thicker, underlying crystalline semiconductor buffer layer 3 of different composition, the latter being in overlying contact with a suitable substrate 4. Typically, and by way of illustration only, the thin, strained lattice semiconductor layer 2 comprises a tensilely strained, crystalline Si layer having a pre-selected thickness (i.e., an initial thickness) from about 100 to about 2,000 Å, grown on a thicker (i.e., up to several $\mu$m thick), strain-relaxed, graded composition Si—Ge buffer layer 3, which buffer layer is in turn formed on a suitable substrate 4, e.g., a crystalline Si wafer or a silicon-on-insulator (SOI) substrate. As indicated supra, when the Si atoms of the strained lattice semiconductor layer 2 are deposited on the Si—Ge buffer layer 3 in alignment with the greater lattice constant (spacing) of the Si and Ge atoms therein, relative to pure Si, the deposited Si atoms tend to "stretch" to align with the underlying lattice of Si and Ge atoms, thereby "stretching' or tensilely straining Si layer 2. Electron and/or hole mobilities in such Si strained lattice semiconductor layers 2 formed on Si—Ge buffer layers 3 can be as much as about 70% faster than in conventional, relaxed lattice Si, and transistors and IC devices formed therewith can be up to about 35% faster than equivalent devices formed with conventional Si, without any requirement for size reduction.

Figure 2:
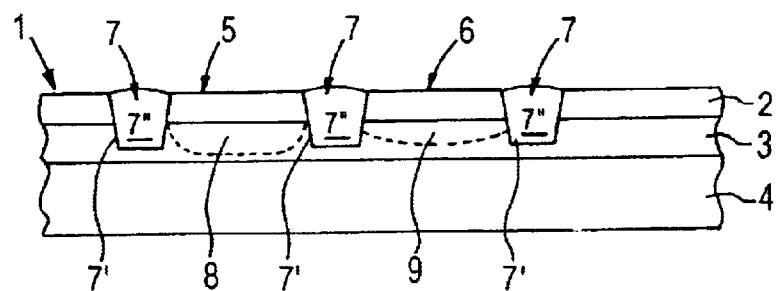

Referring now to FIG. 2, substrate/workpiece 1 is then segmented, as by shallow trench isolation (STI) methodology, to define therein at least one pair of adjacent active device areas or regions 5, 6 separated by STI means 7. Conventional STI methodology comprises initially forming a nitride masking layer over the surface of the substrate/workpiece 1 to differentiate the active device (i.e., source and drain) areas or regions 5, 6 and the STI region 7, with a thin barrier oxide layer preliminarily formed beneath the nitride layer for relieving stress during oxidation. After nitride layer formation, a source/drain mask is utilized for defining the active areas or regions 5, 6 in a resist layer formed over the nitride layer. After masking, the nitride layer is etched away from the STI region 7 while the resist protects the active areas or regions 5, 6. The STI process continues the etch for source/drain (i.e., active area) definition through the nitride and barrier oxide layers into the underlying strained lattice Si and graded composition Si—Ge buffer layers 2, 3, respectively. After a STI trench 7' of a desired depth is formed, the source/drain mask is removed, and a thin liner oxide is formed as to round the top and bottom corners of the STI trench 7' to prevent gate oxide reliability problems and improve subsequent trench fill. Next, a thick oxide layer, e.g., of a silicon oxide, is deposited which covers the active regions 5, 6 with the nitride layer thereon and fills the STI trench 7', which thick oxide layer is then planarized to remove all the oxide over the active device areas or regions 5, 6 leaving the STI trenches 7 filled with oxide insulation 7". The nitride layer is then stripped from the active areas or regions 5, 6 and following the division (or segmentation) of substrate/workpiece 1 into active device areas or regions 5, 6 and STI region 7, n-well and p-well regions 8 and 9 are selectively implanted, in which PMOS and NMOS transistors, respectively, are formed in subsequent processing.

As previously indicated, when PMOS and NMOS transistors are fabricated with narrow widths (i.e., <1 $\mu$m) utilizing STI methodology for segmentation of the substrate into active areas or regions where the transistors are to be formed, a compressive stress is exerted on the upper stratum or layer of the adjacent active device regions of the segmented semiconductor substrate spaced apart by the STI regions 7, which compressive force arises from the insulative material 7", typically a silicon oxide, filling the STI trenches 7. As a consequence, the drive current of a narrow width (i.e., <1 μm) PMOS transistor fabricated on or within an active device area subject to such compressive stress is increased, relative to a similar-dimensioned PMOS transistor formed on or within an unstressed semiconductor substrate, whereas the drive current of a similar narrow width NMOS transistors fabricated on or within the active device area subject to such compressive stress is decreased, relative to a similar-dimensioned NMOS transistors formed on or within an unstressed semiconductor substrate. Also, the drive current of a narrow width PMOS transistor fabricated on or within a tensilely stressed active device area or region (5) formed in a strained lattice semiconductor substrate (1), e.g., strained Si on Si—Ge, is decreased, relative to a similar-dimensioned PMOS transistor formed on or within an unstressed semiconductor substrate, whereas the drive current of a similar narrow width NMOS transistor fabricated on or within a tensilely stressed active device area or region (6) is increased, relative to a similar-dimensioned NMOS transistor formed on or within an unstressed semiconductor substrate.

The present invention takes advantage of both of the above-mentioned competing characteristics or tendencies of narrow width PMOS and NMOS transistor drive currents as a function of tensile and compressive stress by differentially adjusting the thickness of the strained lattice semiconductor layer 2 of each of the active device areas or regions 5, 6 to (1) reduce the tensile stress of the strained lattice semiconductor layer 2 of the active device area or region 5 where the PMOS transistor is to be formed; and (2) increase or maximize the tensile stress of the strained lattice semiconductor layer 2 of the active device area or region 6 where the NMOS transistor is to be formed, whereby the drive current of each of the PMOS and NMOS transistors is maximized.

The former objective (1) is achieved by reducing the thickness of the strained lattice semiconductor layer 2 of the active device area or region 5 where the PMOS transistor is to be formed from the pre-selected initial thickness to a pre-selected final thickness, or by removing the entire pre-selected initial thickness of the strained lattice semiconductor layer 2 of the PMOS area or region; and the latter objective (2) is achieved by maintaining the thickness of the strained lattice semiconductor layer 2 of the active device area or region 6 where the NMOS transistor is to be formed, or by increasing the thickness of the strained lattice semiconductor layer 2 of the active device area or region 6 where the NMOS transistor is to be formed from the pre-selected initial thickness to a pre-selected final thickness.

By way of illustration only, for a strained lattice semiconductor substrate/workpiece 1 comprising a strained lattice Si semiconductor layer 2 having a pre-selected initial thickness $t_{Si}$ from about 100 to about 2,000 Å, the pre-selected final (i.e., reduced) thickness $ts_{Si}$ PMOS of strained Si layer 2 in the PMOS area or region 5 thereof may range from about 0 to about 1,800 Å; whereas the pre-selected final thickness $t_{Si-NMOS}$ of strained Si layer 2 in the NMOS area or region 6 thereof may range from at least the pre-selected initial thickness of about 100 to about 2,000 Å or greater, such that $t_{Si-PMOS} < t_{Si-NMOS}$.

Figure 3A:
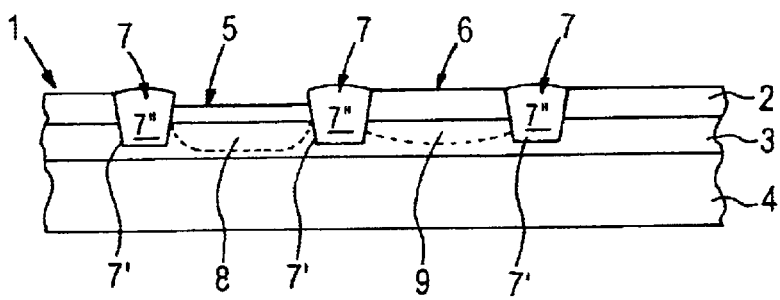
FIGS. 3(A)–3(C) are schematic, simplified, cross-sectional views illustrating examples of alternate CMOS precursor structures formed according to the inventive methodology.
Figure 3B:
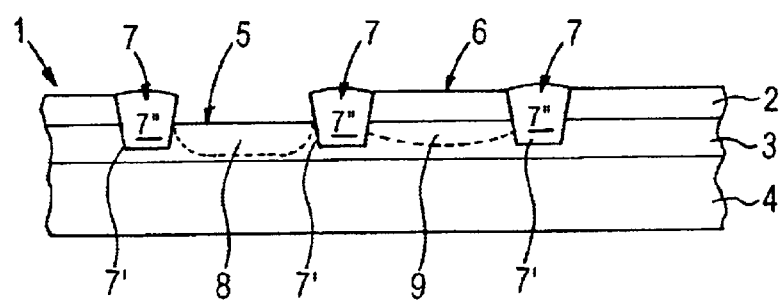
Figure 3C:
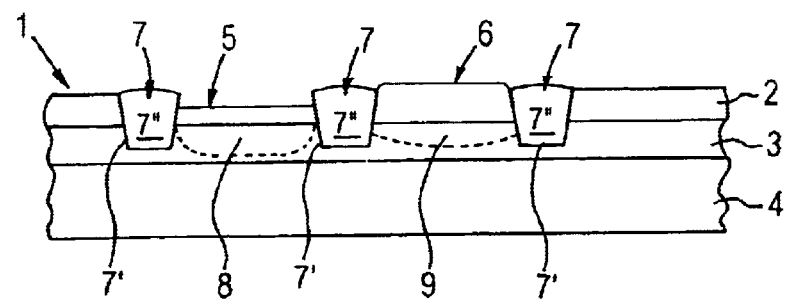

Adverting to FIGS. 3(A)–3(C), shown therein, in simplified, cross-sectional view, are several illustrative, but non-limitative, examples of structures wherein the thickness of the strained lattice semiconductor layer 2 (e.g., Si) of each of the PMOS and NMOS regions are differentially adjusted to satisfy the above condition $t_{Si-PMOS} < t_{Si-NMOS}$, whereby the drive currents of both PMOS and NMOS transistors subsequently formed in the respective PMOS and NMOS areas or regions 5 and 6. For example, FIG. 3(A) illustrates an example where $t_{Si-PMOS} < t_{Si-NMOS} = t_{Si}$, i.e., the thickness of the Si strained lattice semiconductor layer 2 of the PMOS area or region 5 is reduced (as by etching) from the initial thickness $t_{Si}$ and the thickness of the Si strained lattice semiconductor layer 2 of the NMOS area or region 6 is maintained at the initial thickness $t_{Si}$. FIG. 3(B) illustrates an example where $t_{Si-PMOS} = 0$, i.e., the Si strained lattice semiconductor layer 2 of the PMOS area or region 5 is completely removed and the thickness of the Si strained lattice semiconductor layer 2 of the NMOS area or region 6 is maintained at the initial thickness $t_{Si}$. FIG. 3(C) illustrates an example wherein the thickness of the Si strained lattice semiconductor layer 2 of the PMOS area or region 5 is reduced from the initial thickness $t_{Si}$ and the thickness of the Si strained lattice semiconductor layer 2 of the NMOS area or region 6 is increased (as by deposition) from the initial thickness $t_{Si}$.

Each of the illustrated structures, as well as additional structures not specifically illustrated but nonetheless satisfying the condition $t_{Si-PMOS} < t_{Si-NMOS}$, are readily fabricated by conventional selective masking techniques, followed by selective removal of part or all of the thickness of the Si strained lattice semiconductor layer 2 of the PMOS area or region 5, selective deposition of additional Si strained lattice semiconductor material on the Si strained lattice semiconductor layer 2 of the NMOS area or region 6, or a combination of the former techniques for reducing the thickness of the Si strained lattice semiconductor layer 2 of the PMOS area or region 5 and increasing the thickness of the Si strained lattice semiconductor layer 2 of the NMOS area or region 6. In this regard, the semiconductor removal and/or deposition process(es) utilized for reducing or increasing the thickness of the tensilely strained lattice semiconductor layer of the respective active device areas from the pre-selected initial thickness $t_{Si}$ to the pre-selected final thickness $t_{Si-PMOS}$, $t_{Si-NMOS}$ must be selected from among semiconductor removal and deposition processes which, by themselves, do not affect the tensile stress of the tensilely strained lattice semiconductor layer, so that the goal of obtaining enhanced device performance attributed to the tensilely strained lattice semiconductor layer is not compromised. Suitable semiconductor removal processes according to the invention therefore include wet chemical etching and low impact energy ion and/or plasma etching; and suitable semiconductor deposition processes include low impact physical vapor deposition (PVD) processes, e.g., vacuum evaporation, and chemical vapor deposition (CVD) processes.

Figure 4A:
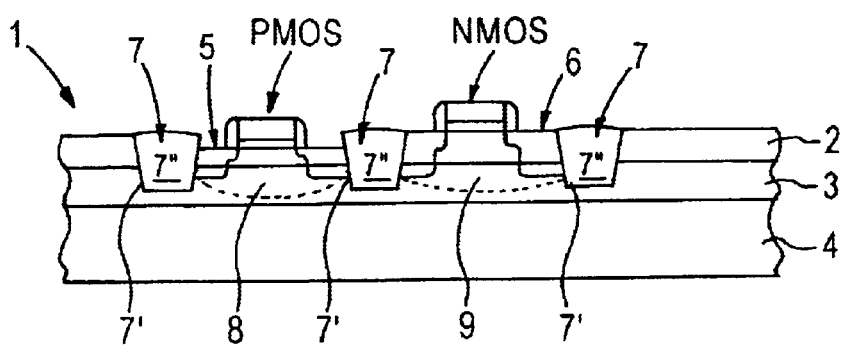
FIGS. 4(A)–4(B) show schematic, simplified, cross-sectional and plan views, respectively, of a CMOS device formed from the precursor structure of FIG. 3(A).
Figure 4B:
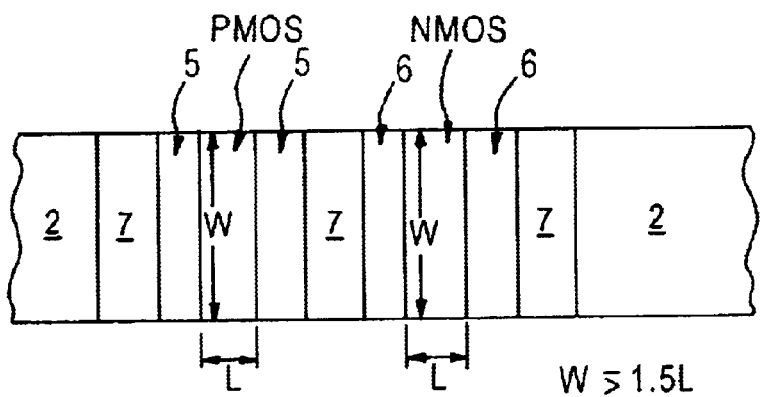

Subsequent processing following the differential adjustment of the thickness of the strained lattice semiconductor layer 2 of the PMOS and/or NMOS areas or regions 5, 6 for forming PMOS and NMOS transistors with maximized drive currents includes a conventional CMOS fabrication sequence (not described in detail for brevity), including steps of gate dielectric deposition, gate electrode formation, selective source/drain extension implantation, sidewall spacer formation, selective source/drain implantation, dopant activation, etc. FIGS. 4(A) and 4(B) show schematic, simplified, cross-sectional and plan views, respectively, of a CMOS device formed from the precursor structure of FIG. 3(A).

The present invention thus enables reliable formation of high-quality, high operating speed semiconductor devices based upon strained lattice technology, including MOS transistors and CMOS devices with maximized transistor drive currents. In addition, the inventive methodology can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, comprising steps of:
   (a) providing a semiconductor substrate comprising an upper, tensilely strained lattice semiconductor layer and a lower, unstressed semiconductor layer; and
   (b) forming a CMOS device comprising at least one pair of PMOS and NMOS transistors in at least one pair of adjacent active device areas on or within said tensilely strained lattice semiconductor layer; wherein the drive current of said PMOS transistor is maximized by reducing the thickness of said tensilely strained lattice semiconductor layer of the respective active device area from an initial thickness to a final thickness, and the drive current of said NMOS transistor is maximized by increasing the thickness of said tensilely strained lattice semiconductor layer of the respective active device area from an initial thickness to a final thickness or by maintaining the thickness of said tensilely strained lattice semiconductor layer of the respective active device area at said initial thickness.

2. The method as in claim 1, wherein:
   step (b) comprises forming said PMOS transistor or NMOS transistor has a narrow width less than about 1 $\mu$m.

3. The method as in claim 2, wherein:
   step (a) comprises providing said semiconductor substrate wherein said upper, tensilely strained lattice semiconductor layer has a pre-selected initial thickness; and
   step (b) comprises a step of regulating the drive current of said PMOS transistor by reducing the thickness of said tensilely strained lattice semiconductor layer from said pre-selected initial thickness to a pre-selected final thickness.

4. The method as in claim 2, wherein:
   step (a) comprises providing a said semiconductor substrate wherein said upper, tensilely strained lattice semiconductor layer has a pre-selected initial thickness; and
   step (b) comprises a step of regulating the drive current of said NMOS transistor by increasing the thickness of said tensilely strained lattice semiconductor layer from said pre-selected initial thickness to a pre-selected final thickness.

5. A method of manufacturing a semiconductor device, comprising steps of:
   (a) providing a semiconductor substrate comprising an upper, tensilely strained lattice semiconductor layer and a lower, unstressed semiconductor layer; and
   (b) forming at least one MOS transistor on or within said tensilely strained lattice semiconductor layer, wherein said forming comprises a step of regulating the drive current of said at least one MOS transistor by adjusting the thickness of said tensilely strained lattice semiconductor layer, wherein:
   step (a) comprises providing a said semiconductor substrate wherein said upper, tensilely strained lattice semiconductor layer has a pre-selected initial thickness; and
   step (b) comprises steps of:
      ($b_1$) segmenting said substrate into at least one pair of adjacent active device areas separated by isolating means; and
      ($b_2$) forming a CMOS device comprising at least one pair of PMOS and NMOS transistors in said at least one pair of adjacent active device areas; wherein the drive current of said PMOS transistor is maximized by reducing the thickness of said tensilely strained lattice semiconductor layer of the respective active device area from said pre-selected initial thickness to a pre-selected final thickness, and the drive current of said NMOS transistor is maximized by increasing the thickness of said tensilely strained lattice semiconductor layer of the respective active device area from said pre-selected initial thickness to a pre-selected final thickness or by maintaining the thickness of said tensilely strained lattice semiconductor layer of the respective active device area at said pre-selected initial thickness.

6. The method as in claim 5, wherein:
   step (a) comprises segmenting said substrate into said at least one pair of adjacent active device areas separated by shallow trench isolation (STI) means.

7. The method as in claim 5, wherein:
   step (b) comprises reducing or increasing the thickness of said tensilely strained lattice semiconductor layer of the respective active device areas from said pre-selected initial thickness to said pre-selected final thickness by means of a semiconductor material removal or deposition process which, by itself, does not affect the tensile stress of said tensilely strained lattice semiconductor layer, whereby obtainment of device performance enhancements attributed to said tensilely strained lattice semiconductor layer is not compromised.

8. The method as in claim 1, wherein:
   step (a) comprises providing said semiconductor substrate including an upper, tensilely strained, crystalline silicon (Si) semiconductor layer lattice-matched to a lower, unstressed, crystalline silicon-germanium (Si—Ge) layer.

9. The method as in claim 8, wherein:
   step (a) further comprises providing said semiconductor substrate comprising a crystalline Si layer or wafer beneath said lower, unstressed, crystalline silicon-germanium (Si—Ge) layer.

10. A semiconductor device, comprising:
    (a) a semiconductor substrate including an upper, tensilely strained lattice semiconductor layer and a lower, unstressed semiconductor layer; and
    (b) at least one CMOS device comprising at least one pair of PMOS and NMOS transistors in at least one pair of adjacent active device areas on or within said tensilely strained lattice semiconductor layer; wherein the drive current of said PMOS transistor is maximized by reducing the thickness of said tensilely strained lattice semiconductor layer of the respective active device area from an initial thickness to a final thickness, and the drive current of said NMOS transistor is maximized by increasing the thickness of said tensilely strained lattice semiconductor layer of the respective active device area from an initial thickness to a final thickness or by maintaining the thickness of said tensilely strained lattice semiconductor layer of the respective active device area at said initial thickness.

11. The semiconductor device according to claim 10, wherein:
said PMOS transistor or NMOS transistor has a narrow width less than about 1 $\mu$m.

12. The semiconductor device according to claim 11, wherein:
said NMOS transistor and the drive current thereof is regulated to a pre-selected value by maintaining the thickness of said tensilely strained lattice semiconductor layer of the respective active device area at said initial thickness.

13. The semiconductor device according to claim 11, wherein:
said NMOS transistor and the drive current thereof is regulated to a pre-selected value by increasing the thickness of said tensilely strained lattice semiconductor layer from a pre-selected initial thickness to a pre-selected final thickness.

14. A semiconductor device, comprising:
(a) a semiconductor substrate including an upper, tensilely strained lattice semiconductor layer and a lower, unstressed semiconductor layer; and
(b) at least one MOS transistor formed on or within said tensilely strained lattice semiconductor layer, wherein the drive current of said at least one MOS transistor is regulated to a pre-selected value by adjustment of the thickness of said tensilely strained lattice semiconductor layer, wherein:
said semiconductor substrate is segmented into at least one pair of adjacent active device areas separated by isolating means; and
said semiconductor device is a CMOS device comprising at least one pair of PMOS and NMOS transistors formed in said at least one pair of adjacent active device areas; wherein the drive current of said PMOS transistor is maximized by reducing the thickness of said tensilely strained lattice semiconductor layer of the respective active device area from a pre-selected initial thickness to a pre-selected final thickness, and the drive current of said NMOS transistor is maximized by increasing the thickness of said tensilely strained lattice semiconductor layer of the respective active device area from a pre-selected initial thickness to a pre-selected final thickness or by maintaining the thickness of said tensilely strained lattice semiconductor layer of the respective active device area at a pre-selected initial thickness.

15. The semiconductor device according to claim 14, wherein:
said substrate is segmented into said at least one pair of adjacent active device areas by shallow trench isolation (STI) means.

16. The semiconductor device according to claim 14, wherein:
said thickness of said tensilely strained lattice semiconductor layer of the respective active device areas is reduced or increased from said pre-selected initial thickness to said pre-selected final thickness by means of a semiconductor material removal or deposition process which, by itself does not affect the tensile stress of said tensilely strained lattice semiconductor layer, whereby obtainment of device performance enhancements attributed to said tensilely strained lattice semiconductor layer is not compromised.

17. The semiconductor device according to claim 14, wherein:
said semiconductor substrate includes an upper, tensilely strained, crystalline silicon (Si) semiconductor layer lattice-matched to a lower, unstressed, crystalline silicon-germanium (Si—Ge) layer.

18. The semiconductor device according to claim 17, wherein:
said semiconductor substrate further includes a crystalline Si layer or wafer beneath said lower, unstressed, crystalline silicon-germanium (Si—Ge) layer.

19. The semiconductor device according to claim 10, wherein:
said semiconductor substrate includes an upper, tensilely strained, crystalline silicon (Si) semiconductor layer lattice-matched to a lower, unstressed, crystalline silicon-germaniun (Si—Ge) layer.

20. The semiconductor device according to claim 19, wherein:
said semiconductor substrate further includes a crystalline Si layer or wafer beneath said lower, unstressed, crystalline silicon-germanium (Si—Ge) layer.

* * * * *